(12) United States Patent
Kitahara et al.

(10) Patent No.: US 6,290,340 B1
(45) Date of Patent: *Sep. 18, 2001

(54) MULTI-LAYER INK JET PRINT HEAD AND MANUFACTURING METHOD THEREFOR

(75) Inventors: Kohei Kitahara, Nagano; Yukihisa Takeuchi, Aichi; Hideo Masumori, Aichi; Nobuo Takahashi, Aichi; Hideaki Sonehara, Nagano, all of (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 26 days.

(21) Appl. No.: 08/905,094

(22) Filed: Aug. 1, 1997

Related U.S. Application Data

(63) Continuation of application No. 08/773,259, filed on Dec. 23, 1996, and a continuation of application No. 08/735,445, filed on Jan. 2, 1997, now Pat. No. 5,933,170, which is a continuation of application No. 08/396,775, filed on Mar. 1, 1995, now abandoned, and a continuation of application No. 08/066,193, filed on May 25, 1993, now abandoned.

(51) Int. Cl.⁷ .............................. B41J 2/045; H04R 17/00
(52) U.S. Cl. ............................................. 347/70; 29/25.35
(58) Field of Search ...................... 347/68–71; 29/890.1, 29/25.35; 451/36, 104, 113

(56) References Cited

U.S. PATENT DOCUMENTS

| | | |
|---|---|---|
| 3,747,120 | 7/1973 | Stemme . |
| 3,946,398 | 3/1976 | Kyser et al. . |
| 4,014,029 | 3/1977 | Lane et al. . |
| 4,438,364 * | 3/1984 | Morison .............................. 310/328 |
| 4,520,374 | 5/1985 | Koto . |
| 4,528,575 | 7/1985 | Matsuda et al. . |
| 4,680,595 | 7/1987 | Cruz-Uribe et al. . |
| 4,695,854 | 9/1987 | Cruz-Uribe . |

(List continued on next page.)

FOREIGN PATENT DOCUMENTS

| | | |
|---|---|---|
| 32 08 104 A1 | 9/1983 | (DE) . |
| 36 28 346 | 2/1988 | (DE) . |

(List continued on next page.)

OTHER PUBLICATIONS

Patent Abstracts of Japan, vol. 10, No. 270 (M–517); Sep. 13, 1986 (JP 61–092863).

*Primary Examiner*—Safet Metjahic
*Assistant Examiner*—Raquel Yvette Gordon
(74) *Attorney, Agent, or Firm*—Sughrue, Mion, Zinn, Macpeak & Seas, PLLC

(57) ABSTRACT

An ink jet print head is disclosed which includes a flow path unit with nozzles, a pressure generating unit disposed on the flow path unit and having ink pressure chambers formed behind the respective nozzles, and piezoelectric/electrostrictive elements each disposed on a wall defining a corresponding ink pressure chamber, for deforming the wall to change a pressure of the ink pressure chamber, whereby the ink in the ink pressure chamber is jetted through the corresponding nozzle. The pressure generating unit includes a spacer plate having windows which closed by a closure plate and a connecting plate disposed on the spacer plate, so as to give the respective ink pressure chambers. The connecting plate has communication holes through which the ink pressure chambers communicate with the nozzles. The spacer plate, closure plate and connecting plate are formed from respective ceramic green sheets, which are laminated on each other and fired into an integral ceramic structure as the pressure generating unit. The piezoelectric/electrostrictive element includes a pair of electrodes and a piezoelectric/electrostrictive layer, which are formed by a film-forming method on an outer surface of the closure plate.

6 Claims, 13 Drawing Sheets

U.S. PATENT DOCUMENTS

| | | |
|---|---|---|
| 4,730,197 | 3/1988 | Raman et al. . |
| 4,766,671 * | 8/1988 | Utsumi et al. ................. 347/71 |
| 4,769,654 | 9/1988 | Tanaka et al. . |
| 4,855,752 | 8/1989 | Bergstedt . |
| 4,937,597 | 6/1990 | Yasuhara et al. . |
| 5,087,930 | 2/1992 | Roy et al. . |
| 5,126,615 | 6/1992 | Takeuchi et al. . |
| 5,128,694 | 7/1992 | Kanayama . |
| 5,258,774 | 11/1993 | Rogers . |
| 5,289,209 | 2/1994 | Suzuki et al. . |
| 5,359,354 | 10/1994 | Hiraishi et al. . |
| 5,367,324 | 11/1994 | Abe et al. . |
| 5,376,856 | 12/1994 | Takeuchi et al. . |
| 5,402,926 | 4/1995 | Takeuchi et al. . |
| 5,463,412 | 10/1995 | Matsuda . |
| 5,475,279 | 12/1995 | Takeuchi et al. . |
| 5,489,930 | 2/1996 | Anderson . |
| 5,860,202 * | 1/1999 | Okawa et al. ................. 29/25.35 |

FOREIGN PATENT DOCUMENTS

| | | |
|---|---|---|
| 416 540 | 3/1991 | (EP) . |
| 416540 | 3/1991 | (EP) . |
| 0 426 473 | 5/1991 | (EP) . |
| 0 443 628 | 8/1991 | (EP) . |
| 0 554 907 A3 | 8/1993 | (EP) . |
| 0 572 230 A2 | 12/1993 | (EP) . |
| 0 572 231 A2 | 12/1993 | (EP) . |
| 0 584 823 A1 | 3/1994 | (EP) . |
| 2 182 611 | 5/1987 | (GB) . |
| 58-87060 | 5/1983 | (JP) . |
| 58-116163 | 7/1983 | (JP) . |
| 60-232967 | 11/1985 | (JP) . |
| 62-101455 | 5/1987 | (JP) . |
| 62-111758 | 5/1987 | (JP) . |
| 62-213399 | 9/1987 | (JP) . |
| 63-22988 | 5/1988 | (JP) . |
| 63-149159 | 6/1988 | (JP) . |
| 3-128681 | 5/1991 | (JP) . |
| 3-64311 | 10/1991 | (JP) . |
| 5-147210 | 6/1993 | (JP) . |
| 5-318735 | 12/1993 | (JP) . |
| WO 89/07752 | 8/1989 | (WO) . |

* cited by examiner

MULTI-LAYER INK JET PRINT HEAD AND MANUFACTURING METHOD THEREFOR

This is a continuation application Ser. Nos. 08/773,259 and 08/735,445 now U.S. Pat. No. 5,933,170, respectively filed on Dec. 23, 1996 and Jan. 2, 1997, which are respective continuations of U.S. application Ser. Nos. 08/396,775 filed Mar. 1, 1995 and 08/066,193, filed May 25, 1993, which are now abandoned, the disclosures of which are incorporated herein by reference.

BACKGROUND OF THE INVENTION

1. Field of the Invention

The present invention relates in general to an ink jet print head and method of manufacturing the same, and more particularly, to an ink jet print head which has a novel structure that assures improved and stable ink-jetting characteristics or capability, and which is available at a reduced cost. The ink jet print head according to the present invention includes piezoelectric/electrostrictive elements provided in pressure chambers communicated with nozzle openings which compress the ink pressure chambers to form ink droplets. The ink jet print head is formed by arranging a nozzle plate, ink pressure chamber forming members and a vibrating plate on one another.

2. Discussion of the Prior Art

In the recent market of printers used as output devices of computers and the like, there is a rapidly increasing demand for an ink jet printer which operates quietly at relatively low cost. The ink jet printer includes an ink jet print head which is generally adapted to raise the pressure in an ink chamber filled with a mass of ink, to thereby jet or discharge fine ink particles of ink from nozzles so as to effect printing.

There is known one type of the ink jet print head which has piezoelectric/electrostrictive elements respectively disposed on a wall of the ink pressure chambers, as means for raising the pressure in the ink pressure chambers as described above. More particularly, piezoelectric/electrostrictive elements, such as piezoelectric transducers, are coupled to diaphragms which form walls of respective ink pressure chambers, wherein displacement of the piezoelectric transducers varies the volume of the ink pressure chambers to thereby eject ink droplets. In this type of printhead, a volume of the ink pressure chamber is changed upon energization and displacement of the piezoelectric transducers.

The ink jet print head of this type is advantageous in reduced consumption of electric power, as compared with another type of ink jet print head which is adapted to heat the ink by a heater disposed in the ink chamber, to generate minute bubbles used for jetting the fine ink particles. The above-described ink jet print head is also advantageous in that, since the displacement of the diaphragms by the piezoelectric transducers takes place over a relatively large area of the ink pressure chambers, ink droplets can be formed stably.

FIGS. 5 and 6 illustrate an example of the above type of ink jet print head. A metallic nozzle plate 4 having a plurality of nozzles 2, a metallic orifice plate 8 having plurality of orifices 6, and a channel plate 10 are superposed on each other such that the channel plate 10 is interposed between the plates 4, 8, and these plates 4, 8, 10 are bonded together into an flow path unit 16. In this flow path unit 16, there are formed a plurality of ink discharge channels 12 for leading or guiding an ink material to the respective nozzles 2, and at least one ink supply channel 14 for leading or supplying the ink material to the orifices 6.

The ink jet print head further includes a pressure generating unit 24 which consists of two plates 18, 20 made of metal or synthetic resin and formed in lamination on the flow path unit 16. The pressure generating unit 24 has a plurality of voids 22 which correspond to the nozzles 2 and orifices 6. With this pressure generating unit 24 superposed on and bonded to the flow path unit 16, each of the voids 22 provides an ink pressure chamber 26 formed behind the corresponding nozzle and orifice 2, 6. The ink jet print head also includes a plurality of piezoelectric/electrons respective elements 28, such as piezoelectric transducers, each of which is secured to a wall of the corresponding ink pressure chamber 26 remote from the flow path unit 16.

In producing the above type of ink jet print head, however, small pieces of the piezoelectric/electrostrictive elements 28 must be bonded to the walls of the respective ink pressure chambers 26, which makes it extremely difficult to render the resulting print head sufficiently small-sized. Further, the bonding of the piezoelectric/electrostrictive elements 28 inevitably pushes up the cost of manufacture of the print head, and makes it difficult for the elements 28 to maintain sufficiently high reliability.

In the production of the above-described ink jet print head, another problem arises when the flow path unit 16 and pressure generating unit 24 are bonded together. Namely, the spacing between the adjacent voids 22, 22 formed in the print head, that is, the thickness "t" of a partition wall 30 which separates the adjacent voids from each other, is considerably small, ore precisely, about 1 mm or smaller. Such a small spacing between the voids 22 makes it extremely difficult to bond the flow path unit 16 and the pressure generating unit 24 to each other.

More specifically, an adhesive used for bonding the flow path unit 16 and the pressure generating unit 24 is likely to overflow onto the opposite surfaces of the partition wall 30. Therefore, the ink pressure chambers 26 and/or ink flow channels including the ink supply and discharge channels 12, 14 and orifices 6 may be deformed, whereby the ink-jetting characteristics of the print head may deteriorate, resulting in reduced quality and yield of the products print heads).

If the amount of the adhesive applied is reduced to avoid its overflow as described above, it is likely that the flow path unit 16 and pressure generating unit 24 are insufficiently or poorly bonded together at some portions of the interface of the members 16, 24. This may result in incomplete sealing between the adjacent ink pressure chambers 26, 26, causing leakage of the pressures of the ink pressure chambers 26, 26 and consequent crosstalk for example. The partial or insufficient bonding may also leave gaps between the bonding surfaces of the units 16, 24, resulting in pressure loss upon pressurizing of the ink pressure chambers 26 due to the air remaining the gaps. Consequently, the ink-jetting characteristics of the print head may be lowered.

In the ink jet type print head disclosed in Japanese Unexamined Patent Publication No. Sho. 62-111758, pressure generating members including diaphragms and flow path forming members are formed in a layered construction, and nozzle openings are provided in a row extending parallel to the direction of displacement of the diaphragm, thereby to reduce the thickness of the print head. That is, the print head has a layered structure.

The layered structure is advantageous in that the print head can be miniaturized, and it can be manufactured using a simple method for joining plate members formed by pressing or etching.

In the manufacturing method for producing the print head, an adhesive agent is used for joining the plate members. However, during manufacture, as noted above, the adhesive agent can sometimes flow into small holes which form ink flow paths in the plate members, thus changing the ink flow resistance thereof, lowering the reliability in operation of the print head. Furthermore, because the piezoelectric/electrostrictive elements must be fixed to the diaphragm with an adhesive agent or by etching or laser welding, the manufacture of the print head requires much time and labor.

In order to eliminate the above-described difficulties, an ink it type print head has been proposed, for example, in Japanese Unexamined Patent Publication No. Sho. 63-149159, which is formed by layering ceramic plates in a semi-solid state, shaped as require to form flow path members, and piezoelectric transducers, one on another and subjecting the structure to firing. That is, the print head is manufactured without a separate step of mounting the piezoelectric transducers. However, the method is still disadvantageous in that it cannot achieve a reduction in the thickness of the print head since the nozzle openings extend in a direction perpendicular to the direction of displacement of the diaphragm.

SUMMARY OF THE INVENTION

It is therefore an object of the present invention to provide an ink jet print head in which a flow path unit and a pressure generating unit can be easily bonded to each other, to alleviate or eliminate the above problems due to incomplete bonding of the members or overflow of an adhesive from their bonding surfaces, thereby assuring excellent ink-jetting characteristics with high stability.

It is also an object of the invention to provide such an ink jet print head which can be easily produced with improved efficiency, and which is sufficiently small-sized.

It is a further object of the present invention to provide an jet print head in which the manufacturing assembly accuracy is improved, the number of steps required for joining the relevant members is minimized, and the nozzle openings are provided in parallel with the direction of displacement of the diaphragms to reduce the thickness of the print head.

Another object of the invention is provide a method for manufacturing such an ink jet print head.

The above object may be accomplished according to the principle of the present invention, which provides an ink jet print head comprising: a flow path unit having a plurality of nozzles through which fine particles of an ink are jetted; a pressure generating unit disposed on and bonded to the flow path unit, the pressure generating unit having a plurality of ink pressure chambers formed behind the respective nozzles of the flow path unit, the pressure generating unit comprising a spacer plate having a plurality of windows which provide the ink pressure chambers, respectively, a closure plate disposed on one of opposite major surfaces of the spacer plate remote from the flow path unit, for closing one of opposite openings of each of the windows, and a connecting plate disposed on the other major surface of the spacer plate, for closing the other opening of each window, the connecting plate having a plurality of first communication holes located behind the respective nozzles of the flow path unit, for communicating the ink pressure chambers with the respective nozzle, the spacer plate, the closure plate and the connecting plate being formed from respective ceramic green sheets which are laminated on each other and fired into an integral ceramic structure as the pressure generating unit; and a plurality of piezoelectric/electrostrictive elements each disposed on a wall partially defining the corresponding one of the ink pressure chambers, for deforming the wall so as to change a pressure of the corresponding ink pressure chamber, whereby the ink in the ink pressure camber is jetted through the corresponding one of the plurality of nozzles, each of the piezoelectric/electrostrictive elements comprising a piezoelectric/electrostrictive portion consisting of a pair of electrodes and a piezoelectric/electrostrictive layer, which are formed by a film-forming method on an outer surface of the closure plate of the pressure generating unit, such that the piezoelectric/electrostrictive layer is interposed between the pair of electrodes.

In the ink jet print head constructed according to the present invention, an ink flow channel through which the ink flows through the print head is provided with a remarkably improved seal at an interface between the pressure generating unit and the flow path unit. This leads to an effectively improved and stable quality of the print heads produced.

Further, according to the present invention, the piezoelectric/electrostrictive elements can be easily formed by a film-forming method with considerably high efficiency. Therefore, the present print head can be produced with further improved quality and improved production efficiency, while permitting reduction of the size thereof.

In a preferred form of the present invention, the flow path unit has an ink supply channel through which the ink is fed to the ink pressure chambers of the pressure generating unit, and a plurality of orifices for guiding the ink from the ink supply channel to the respective ink pressure chambers. The orifices are open on an outer surface of the flow path unit on which the pressure generating unit is superposed. Further, the connecting plate of the pressure generating unit has a plurality of second communication holes located adjacent the respective orifices of the flow path unit, for communicating the ink pressure chambers with the respective orifices.

In the pressure generating unit, which is made of ceramic, small through-holes are formed in the spacer, which simplifies the manufacturing step of joining the vibrating member or closure plate, the spacer and the connecting plate, and positively prevents leakage of ink past the unit, to which high pressure is exerted. The flow path unit, which is made of metal, has a relatively large through-hole to form the reservoir in the channel plate, and therefore it is high in dimensional accuracy. The pressure generating unit and the flow path unit are joined together with a macromolecular adhesive layer, so that the difference in thermal expansion between the two units, which are made of different materials as described above, can be absorbed.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
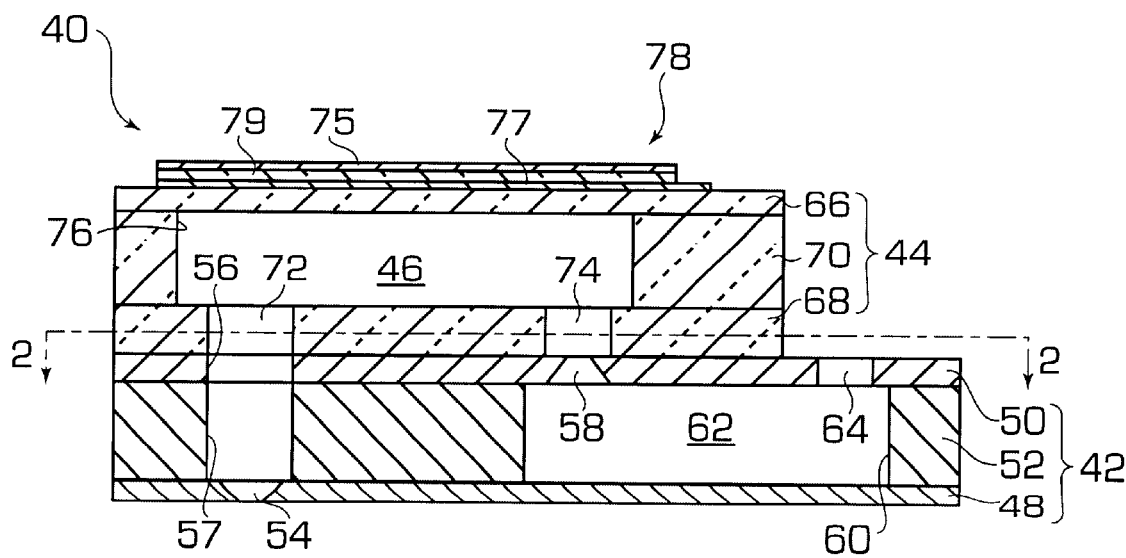
FIG. 1 is a vertical cross sectional view showing one embodiment of an ink jet print head of the present invention.
Figure 2:
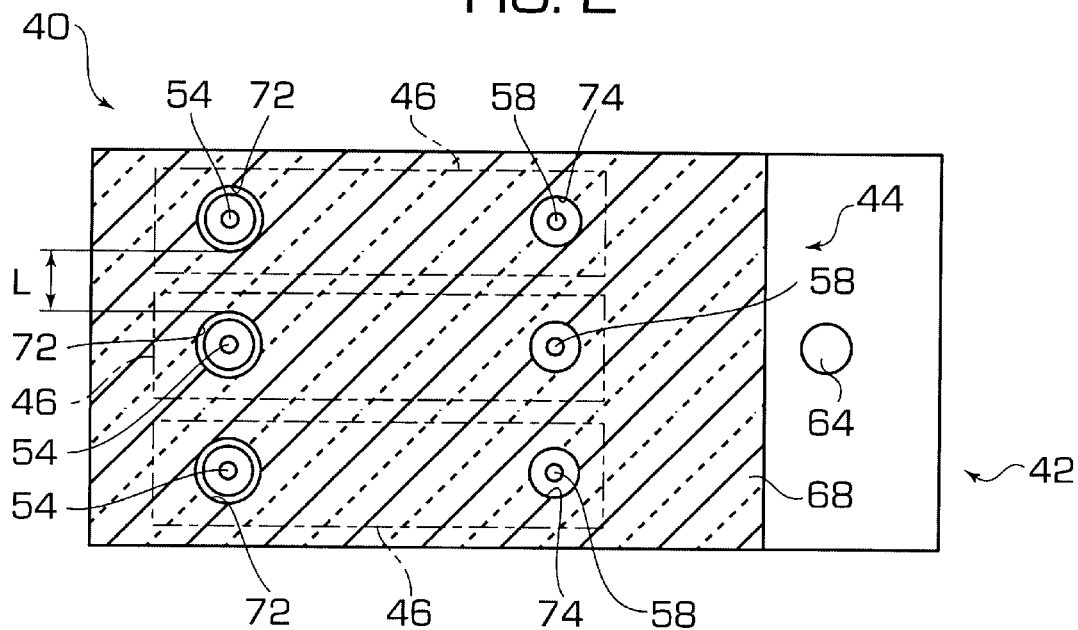
FIG. 2 is a cross sectional view taken along line 2—2 of FIG. 1.
Figure 3:
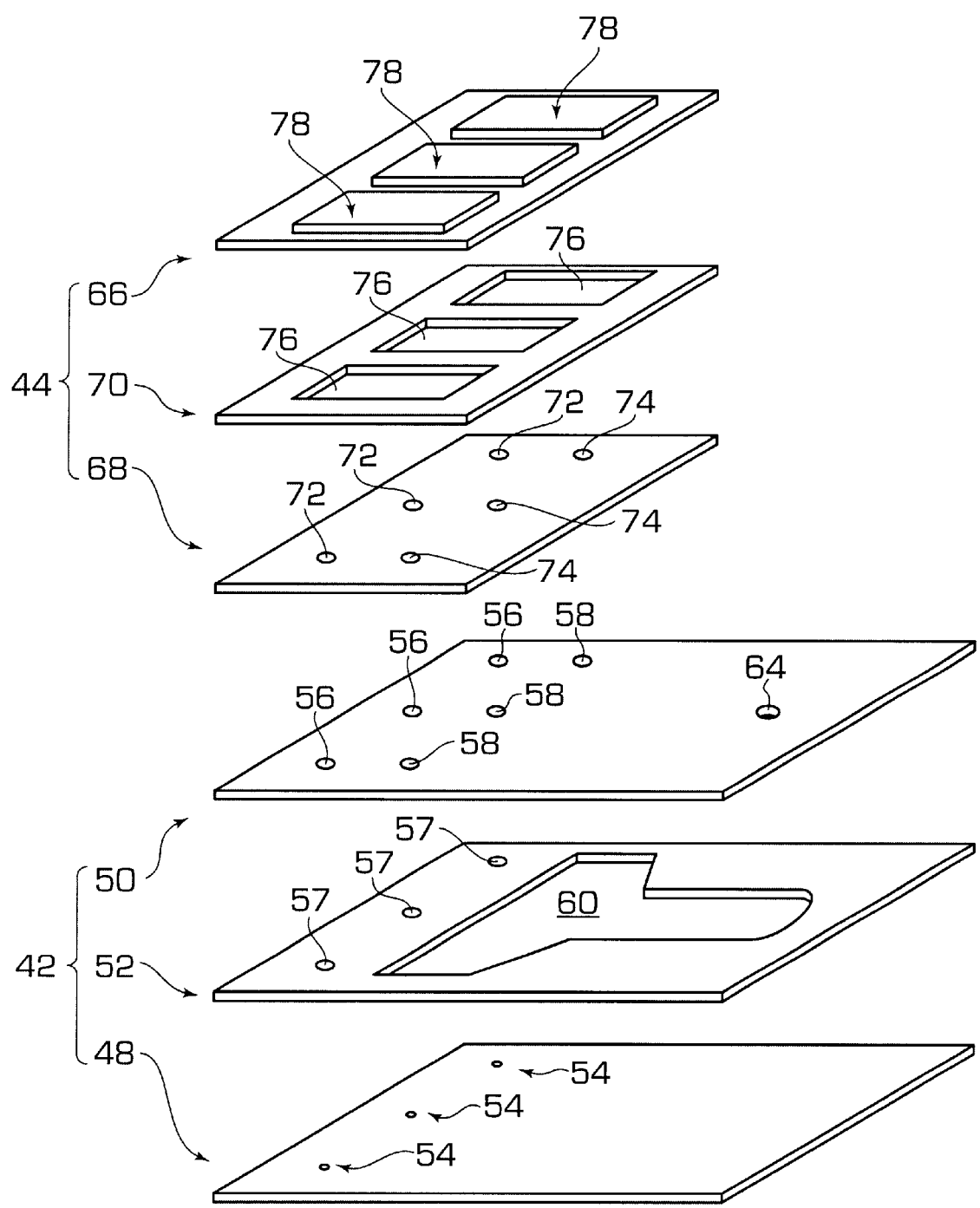
FIG. 3 is an exploded perspective view explaining the construction of the ink jet print head of FIG. 1.

Referring to FIGS. 1 and 2 schematically showing an ink jet print head 40 as one preferred embodiment of the present invention, and to FIG. 3 which is an explode perspective view of the print head 40, a flow path unit 42 and a pressure generating unit 44 are bonded together to form an integral structure of the ink jet print head 40. In this print head 40, an ink material is supplied to a plurality of ink pressure chambers 46 formed in the pressure generating unit 44, and is jetted or discharged from a plurality of nozzles 54 formed through the flow path unit 42.

More specifically, the flow path unit 42 consists of a nozzle plate 48 and an orifice plate 50 having a relatively small thickness, and a channel plate 52 interposed between these plates 48, 50. The nozzle plate 48 and the orifice plate 50 are integrally bonded to the channel plate 52 by means of an adhesive.

The nozzle plate 48 has a plurality of nozzles 54 (three in this embodiment) formed therethrough, for permitting jets of fine ink particles, while the orifice plate 50 and the channel plate 52 have respective through-holes 56, 57 formed through the thicknesses thereof. These through-holes 56, 57 are aligned with the respective nozzles 54 as viewed in the direction of the thickness of the plates 48, 50, 52, and have a diameter which is larger by a given value than that of the nozzles 54.

The orifice plate 50 further has a plurality of orifices 58 (three in this embodiment) formed therethrough, for permitting flow of the ink into to the respective ink pressure chambers 46. The channel plate 52 is formed with a window 60 which is closed at its opposite openings by the nozzle plate 48 and orifice plate 50, respectively, whereby an ink supply channel 62 communicating with the orifices 58 is defined by the channel plate 52, the nozzle plate 48 and the orifice plate 50. The orifice plate 50 further has a supply port 64 through which the ink is fed from an ink reservoir into the ink supply channel 62.

While the material used for the plates 48, 50, 52 of the flow path unit 42 is not particularly limited, these plates 48, 50, 52 are preferably made of a plastic, or a metal such as nickel or stainless steel, which enables the nozzles 54 and orifices 58 to be formed in the respective plates 48, 50 with high accuracy. Each of the orifices 58 is desirably formed in tapered shape such that the diameter of the orifice 58 is reduced in the direction of flow of the ink (i.e., the direction from the ink supply channel 62 toward the ink pressure chambers 46), as shown in FIG. 1 by way of example, so as to function as a check valve for inhibiting the ink from flowing in the reverse direction.

The pressure generating unit 44 consists of a closure plate 66 and connecting plate 68 having a relatively small thickness, and a spacer plate 70 interposed between these plates 66, 68. These plates 66, 68, 70 are superposed on each other and formed integrally into the pressure generating unit 44 in a manner as described later.

The connecting plate 68 has first communication holes 72 and second communication holes 74 formed therethrough, which are respectively aligned with the through-holes 56 and orifices 58 formed in the orifice plate 50, as viewed in the direction of thickness of the plate 68, 50. The diameter of the first communication holes 72 is substantially equal to or slightly larger than that of the through-holes 56, while the diameter of the second communication holes 74 is larger by a given value than that of the orifices 58.

The spacer plate 70 has a plurality of rectangular windows 76 formed therethrough. The spacer plate 70 is superposed on the connecting plate 68 such the each of the windows 76 communicates with the corresponding first and second communication holes 72, 74 formed in the connecting plate 68.

On one of the opposite major surfaces of the spacer plate 70 remote from the connecting plate 68 is superposed the above-indicated closure plate 66 for closing openings of the windows 76. In this arrangement, the ink pressure chambers 46 are formed within the pressure generating unit 44, such that the ink pressure chambers 46 communicate with an exterior space through the first and second communication holes 72, 74.

The pressure generating unit 44 is formed as an integrally formed fired ceramic structure. That is, in the process of producing the pressure generating unit 44, green sheets are initially formed by using a slurry that is prepared from ceramic materials, binders, liquid solvents and others, by means of a generally used device such as a doctor blade device or a reverse roll coater. Then, the green sheets are subjected to suitable processing such as cutting, machining or punching, as needed, so as to form the windows 76 and the first and second communication holes 72, 74. Thus there are formed precursors for the plates 66, 68, 70. These precursors are then laminated on each other and fired into an integral ceramic body as the pressure generating unit 44.

While the ceramic material used for forming the pressure generating unit 44 is not particularly limited, alumina, zirconia or the like may be favorably employed in views of its formability and other properties. The closure plate 66 preferably has a thickness of 50 μm or smaller, more preferably, within a range of about 3 to 12 μm. The connecting plate 68 preferably has a thickness of 10 μm or larger, more preferably, 50 μm or larger. The spacer plate 70 preferably has a thickness of 50 μm or larger, more preferably, 100 μm or larger.

The above-described pressure generating unit 44, which is formed as an integral fired ceramic structure, does not require any particular adhesive treatment for bonding the plates 66, 68, 70 together. Accordingly, complete and secure sealing can be achieved at the interfaces between the closure plate 66 and spacer plate 70 and between the connecting plate 68 and spacer plate 70.

In addition, the pressure generating unit 44 can be produced with improved efficiency, due to the presence of the connecting plate 68. Namely, it is generally difficult to handle a laminar structure consisting of thin, flexible green sheets, and fracture of the laminar structure and abnormal deformation of a resultant fired body tend to occur due to strains induced in the laminar structure when it is inadvertently supported upon its setting on a furnace. In the instant embodiment, however, the laminar structure including the connecting plate 68 exhibits an enhanced rigidity due to the presence of the plate 68, assuring improved handling ease thereof, while reducing the possibility of occurrence of defects due to handling failure, as compared with when the structure does not include the connecting plate 68. Further, it is normally impossible to handle a laminar structure consisting only of the closure plate 66 and spacer plate 70 where the ink pressure chambers 46 are formed with high density in the pressure generating unit 44, that is, where the pressure generating unit 44 includes a comparatively large number of ink pressure chambers 46. In the instant embodiment, however, the connecting plate 68 makes it possible to handle the laminar structure even in the above-described situation.

While the configuration of the pressure generating unit 44 varies depending upon various factors relating to production of this unit 44, it is desirable that the surface of the pressure generating unit 44 which is to be bonded to the flow path unit 42, that is, the outer surface of the connecting plate 68, is made even or smooth. The evenness of the relevant surface of the pressure generating unit 44 is suitably controlled so that the surface has a maximum waviness of not larger than 50 μm as measured along a reference length of 8 mm, by means of a roughness measuring system. Desirably, the maximum waviness of the relevant surface is not larger than 25 μm, more desirably, not larger than 10 μm. As a means for achieving the above degree of surface evenness, the fired ceramic body which gives the pressure generating unit 44 may be subjected to machining such as lapping or surface grinding.

On the pressure generating unit 44, more precisely, on the outer surface of the closure plate 66, there are formed piezoelectric/electrostrictive elements 78, such as piezoelectric transducers, which correspond to the respective ink pressure chambers 46 formed in the pressure generating unit 44. Each of the piezoelectric transducers 78 has a piezoelectric/electrostrictive unit consisting of a lower electrode 77, a piezoelectric/electrostrictive layer 79, and an upper electrode 75, which are formed in lamination on the closure plate 66, by a suitable film-forming method. As the piezoelectric transducer 78 of the instant embodiment, it is particularly preferable to employ a piezoelectric/electrostrictive element as proposed in co-pending U.S. patent application Ser. No. 07/912,920 assigned to the same assignee as the present patent application.

More specifically, the closure plate 66, which serves as a substrate for the piezoelectric/electrostrictive elements 78, is suitably formed by a ceramic substrate made of a material whose major component is zirconia having a crystal phase that is partially or fully stabilized by a suitable compound or compounds. The term "partially or fully stabilize zirconia" used herein should be interpreted to mean zirconia whose crystal phase is partially or fully stabilized, so that the crystal phase partially undergoes or does not undergo phase transformations, respectively, upon application of heat, stress or the like thereto.

The above-indicated compound or compounds for stabilizing the zirconia is selected from the group consisting of: yttrium oxide; cerium oxide; magnesium oxide; and calcium oxide. The zirconia is partially or fully stabilized as desired, by addition of at least one of these compounds, that is, a selected one of the above-indicated oxides or a selected combination of two or more of these oxides. It is desirable to stabilize the zirconia by adding 2 to 7 mole % of yttrium oxide, or 6 to 15 mole % of cerium oxide, or 5 to 12 mole % of magnesium oxide or calcium oxide. It is particularly recommended to use yttrium oxide in an amount of 2 to 7 mole %, more preferably, 2 to 4 mole %, so as to partially stabilize the zirconia. With the addition of the yttrium oxide in the above range, the zirconia has a primary crystal phase which is partially stabilized as a tetragonal phase or a combination of a cubic phase and the tetragonal phase, to provide the ceramic substrate (closure plate 66) having excellent properties. Further, the average crystal grain size of the ceramic substrate is preferably controlled to within a range of 0.05 μm–2 μm, more preferably, to 1 μm or smaller, so as to ensure the presence of the tetragonal phase and assure a sufficiently large mechanical strength of the ceramic substrate.

On the outer surface of the closure plate 66 are formed suitable films of the upper and lower electrodes 75, 77 and the piezoelectric/electrostrictive layers 79, by any one of various known methods which include thick-film forming process such as screen printing, spraying, dipping and coating, and thin-film forming process such as ion-beam method, sputtering, vacuum vapor deposition, ion plating, CVD and plating. These layers 75, 77, 79 may be formed either before or after firing of the closure plate 66 (the pressure generating unit 44). Then, the electrode films 75, 77 and piezoelectric/electrostrictive layer 79 thus formed on the closure plate 66 may be heat-treated as needed, either in different steps following formation of the respective layer 75, 77, 79, or in one step following formation of all of the layer 75, 77, 79. To assure improved reliability of insulation between the electrode films 75, 77, there may be formed as needed an insulating resin layer between the adjacent piezoelectric/electrostrictive layers 79, 79.

The electrode films 75, 77 of each piezoelectric/electrostrictive unit may be formed of any electrically conductive material which can withstand a high-temperature oxidizing atmosphere generated upon the heat-treatment or firing as described above. For instance, the electrode films 75, 77 may be formed of a single metal, an alloy of metals, a mixture of a metal or alloy and an electrically insulating ceramic or glass, or an electrically conductive ceramic. Preferably, the electrode material has as a major component a noble metal having a high melting point, such as platinum, palladium or rhodium, or an alloy such as silver-paladium alloy, silver-platinum alloy or platinum-palladium alloy.

The piezoelectric/electrostrictive layer 79 of each piezoelectric/electrostrictive unit may be formed of any piezoelectric or electrostrictive material which produces a relatively large amount of strain or displacement due to the converse or reverse piezoelectric effect of the electrostrictive effect. The piezoelectric/electrostrictive material may be either a crystalline material or an amorphous material, and may be a semi-conductor material or a dielectric or ferroelectric ceramic material. Further, the piezoelectric/ electrostrictive material may either require a treatment for initial polarization or poling, or may not require such a polarization treatment.

The piezoelectric/electrostrictive material used for the piezoelectric/electrostrictive layer 79 preferably contains as a major component lead zirconate titanate (PZT), lead magnesium niobate (PMN), lead nickel niobate (PNN), lead manganese niobate, lead antimony stannate, lead zinc niobate, lead titanate, or a mixture thereof. The piezoelectric/electrostrictive material having the above major component may further contain as an additive an oxide or other compound of lanthanum, barium, niobium, zinc, cerium, cadnium, chromium, cobalt, strontium, antimony, iron, yttrium, tantalum, tungsten, nickel, and/or manganese, so as to provide a material containing PLZT, for example.

The piezoelectric/electrostrictive unit consisting of the electrode films 75, 77 and the piezoelectric/electrostrictive layer 79 generally has a thickness of not larger than 100 $\mu$m. The thickness of each of the electrode films 75, 77 is generally 20 $\mu$m or smaller, preferably 5 $\mu$m or smaller. To assure a relatively large amount of displacement by application of a relatively low voltage, the thickness of the piezoelectric/electrostrictive layer 79 is preferably 50 $\mu$m or smaller, more preferably, within a range of 3 $\mu$m to 40 $\mu$m.

Since the substrate of the piezoelectric/electrostrictive element 78 is constituted by the closure plate 66 formed of a material having partially stabilized zirconia as a major component, the element 78 exhibits sufficiently high degrees of mechanical strength and toughness even though the plate 66 has a relatively small thickness. At the same time, the thus formed piezoelectric/electrostrictive element 78 can provide a relatively large amount of displacement by application of a relatively low operating voltage, with a relatively large magnitude of force or electric potential generated, and has an improved operating response.

In addition, the film-forming method used for forming the electrode films 75, 77 and the piezoelectric/electrostrictive layer 79 permits a relatively large number of the piezoelectric/electrostrictive elements 78 to be formed on the closure plate 66 of the pressure generating unit 44. That is, in the film-forming process as described above, the elements 78 can be concurrently and easily formed with a minute spacing left between the adjacent ones, without using an adhesive or the like. Accordingly, a plurality of piezoelectric/electrostrictive elements 78 can be easily formed on appropriate portions of the pressure generating unit 44 which correspond to the respective ink pressure chambers 46 formed therein.

After firing the above-described pressure generating unit 44 on which the piezoelectric/electrostrictive elements 78 are integrally formed, the pressure generating unit 44 is superposed on the above-described flow path unit 42, and these units 42, 44 are bonded together by a suitable adhesive, into an integral structure of the ink jet print head 40, as shown in FIG. 1. In the thus formed ink jet print head 40, the ink material which is led through the ink supply channel 62 is supplied to the ink pressure chambers 46 through the respective orifices 58, and is passed through the through-holes 56, 57 and jetted outwards from the nozzles 54, based on the operation of the piezoelectric/electrostrictive elements 78 formed integrally on the pressure generating unit 44.

The adhesive used for bonding the pressure generating unit 44 and flow path unit 42 may be selected from various known adhesives containing any one of vinyl, acryl, polyamide, phenol, resorcinol, urea, melamine, polyester, epoxy, furan, polyurethane, silicone, rubber, polyimide and polyolefin, provided the selected adhesive is resistant to the ink material.

It is desirable in terms of production efficiency that the adhesive is in the form of a highly viscous paste which can be applied by coating using a dispenser, or by screen-printing, or is in the form of a sheet which permits punching thereof. It is more desirable to use a hot-melt type adhesive which requires a relatively short heating time, or an adhesive which is curable at room temperature. The adhesive in the form of a highly viscous paste may be obtained by mixing an adhesive material with a filler so as to increase the viscosity of the resulting adhesive.

In view of the durability with respect to an aqueous ink material, it is particularly preferable to use an elastic epoxy adhesive or silicone-contained adhesive which can be applied by screen-printing, or sheet-like, hot-melt type adhesive containing polyolefin or polyester, which permits punching thereof. It is also possible to apply various adhesives as indicated above to different portions of the bonding surfaces of the pressure generating unit 44 and/or the flow path unit 42.

Upon bonding of the pressure generating unit 44 and the flow path unit 42 as described above, the ink pressure chambers 46 formed in the pressure generating unit 44 are suitably held in communication with the nozzles 54 and the ink supply channel 62 formed in the flow path unit 42, with the first and second communication holes 72, 74 being in communication with the through-holes 56 and orifices 58 formed through the orifice plate 50 of the flow path unit 42, respectively.

To achieve sufficient fluid-tightness of the ink flow channel through which the ink flows in the print head 40, the seal between the bonding surfaces of the pressure generating unit 44 and the flow path unit 42 needs to be well established only at around the first and second communication holes 72, 74. This leads to a significantly reduced area of bonded portions which must provide a complete seal, permitting the ink flow channel to easily and surely assure excellent fluid-tightness.

In this particular embodiment, the diameters of the first and second communication holes 72, 74 are set to be smaller than the width dimension of the ink pressure chamber 46 (the width dimension of the window 76 formed in the spacer plate 70). Therefore, the adjacent ones of the first communication holes 72 and those of the second communication holes 74 are spaced apart from each other by a sufficiently large distance (indicated by "L" in FIG. 2).

The above arrangement assures a sufficiently large area of bonding between the pressure generating unit 44 and the flow path unit 42, around the respective first and second communication holes 72, 74. Accordingly, a further improved seal can be obtained at the bonding surfaces of the units 42,44 even if these units 42,44 are made of different kinds of materials.

Figure 7:
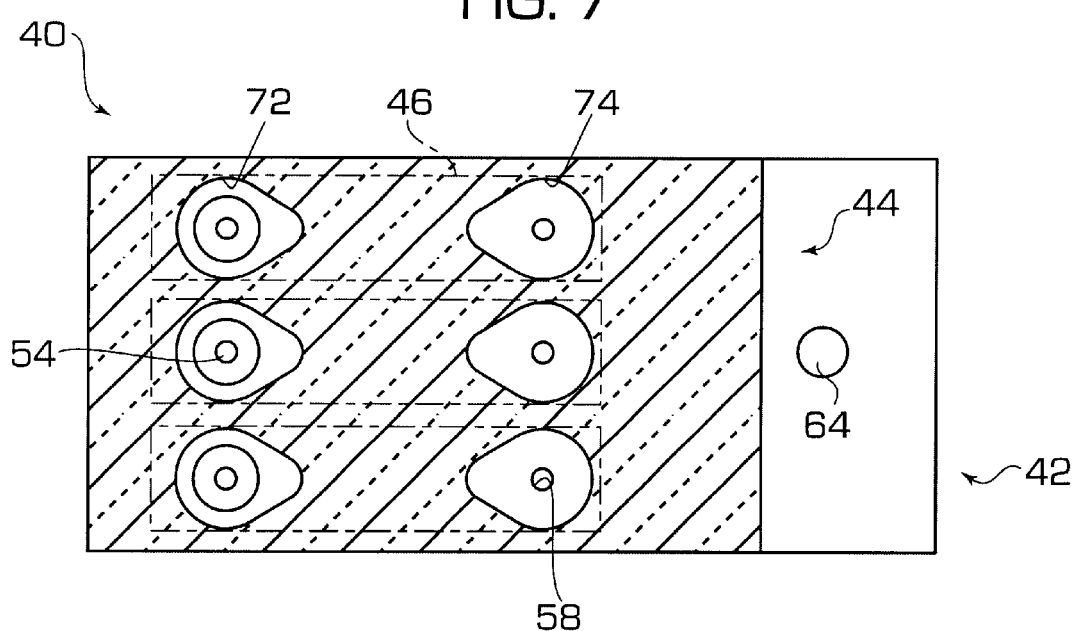
FIG. 7 is a cross sectional view corresponding to that of FIG. 2, showing a modification of first and second communication holes of the ink jet print head of FIG. 1.

Depending upon the kind of adhesive used or the method of application of the adhesive, there is a possibility that the adhesive overflows into the first and second communication holes 72, 74 to thereby close the openings of these holes 72, 74. In this case, it is desirable that the diameter of the first and second communication holes 72, 74 be set to be substantially equal to the width dimension of the corresponding ink pressure chamber 46, so as to avoid the closure of the openings of the holes 72, 74. It is also desirable to form one or both of the first and second communication holes 72 in teardrop shape as shown in FIG. 7, or elliptic shape.

Figure 5:
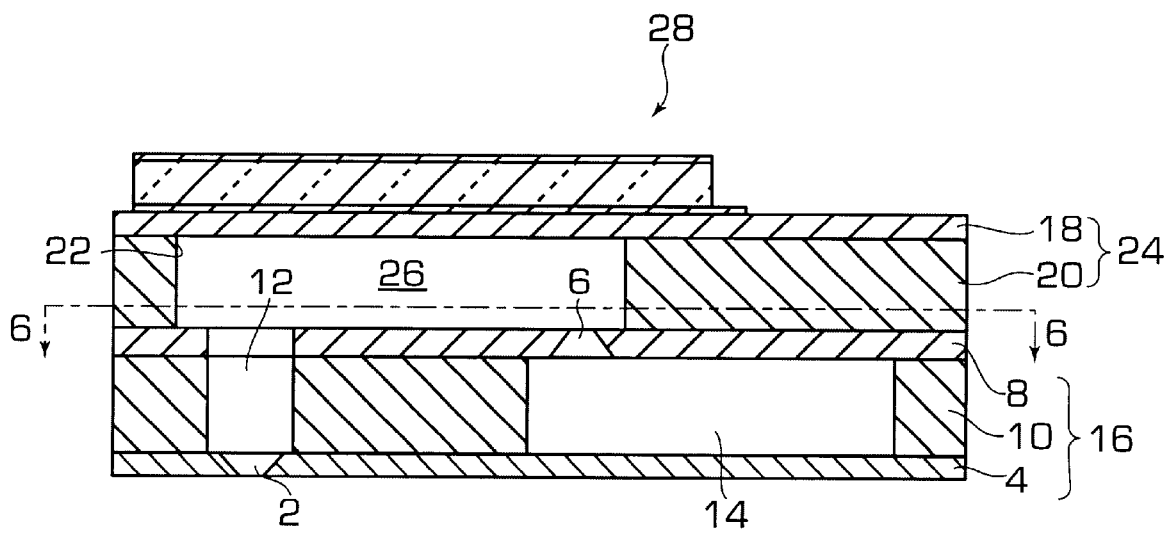
FIG. 5 is a vertical cross sectional view showing one example of conventional ink jet print head.
Figure 6:
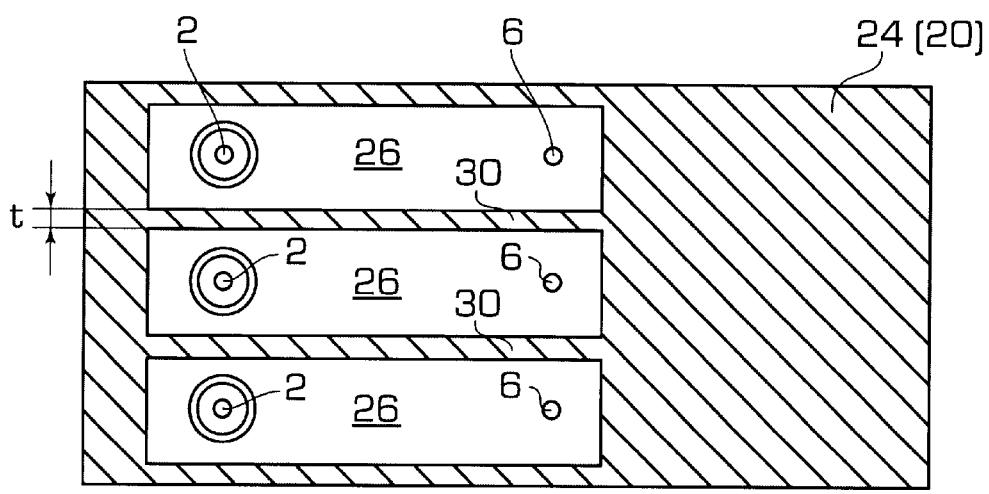
FIG. 6 is a cross sectional view taken along line 6—6 of FIG. 5.

It will be easily understood by comparing the shapes of the bonding surfaces of the flow path unit 42 and the pressure generating unit 44 of the ink jet print head 40 of the instant embodiment, with those of the flow path unit 16 and the pressure generating unit 24 of the conventional ink jet print head as shown in FIGS. 5 and 6 that the print head 40 of the instant embodiment can achieve a significantly improved seal at the bonding surfaces of the units 42, 44, as compared with the conventional counterpart as shown in FIGS. 5 and 6.

Accordingly, the ink jet print head 40 can easily and stably assure sufficient sealing or fluid-tightness of the ink flow channel through which the ink flows, without suffering from the overflow of the adhesive into the ink pressure chambers 46, and otherwise possible gaps formed between the bonding surfaces. Thus, the ink jet print head 40 exhibits significantly improved ink-jetting characteristics.

In producing the ink jet print head 40 as described above, a suitable film-forming method is employed to form the piezoelectric/electrostrictive elements 78 each of which is adapted to deform a portion of the closure plate 66 which defines the corresponding ink pressure chamber 46 to thereby change the internal pressure of the ink pressure chamber 46. Therefore, the piezoelectric/electrostrictive elements 78 can be easily formed on the portions of the closure plate 66 which correspond to the respective ink pressure chambers 46, with high production efficiency, assuring excellent ink-jetting characteristics of the print head with high stability.

Figure 4:
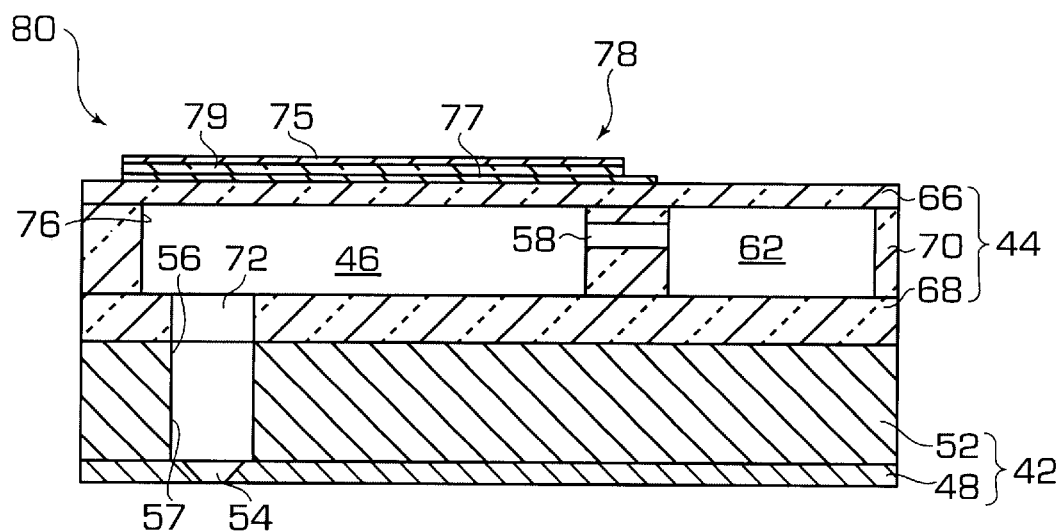
FIG. 4 is a vertical cross sectional view corresponding to that of FIG. 1, showing another embodiment of an ink jet print head of the present invention.

While the ink supply channel 62 through which the ink is fed into the ink pressure chambers 46 is formed within the flow path unit 42 in the illustrated embodiment, the in supply channel 62 may be formed within the pressure generating unit 44, as shown in FIG. 4 by way of example. In this figure, the same numerals as used in FIG. 1 showing the first embodiment are used for identifying structurally or functionally corresponding elements, so as to facilitate understanding of the embodiment of FIG. 4.

The structure and material of the flow path unit 42 are by no means limited to those of the illustrated embodiment. For instance, it is possible to form the whole or a part of the flow path unit 42 as an integral body, by injection molding using a synthetic resin material or the like, or any other molding technique.

Further, the position and number of the nozzles 54 and orifices 58 formed in the flow path unit 42, and the position and number of the ink pressure chambers 46 formed in the pressure generating unit 44 are not limited to those of the illustrated embodiment, but may be suitably selected.

Figure 8:
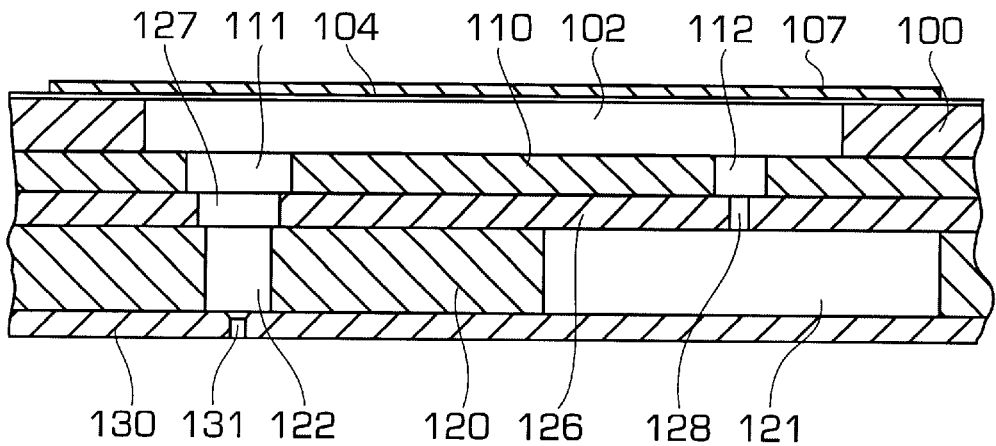
FIG. 8 is a sectional view showing another multi-layer type ink print head constructed in accordance with a preferred embodiment of the invention.
Figure 10:
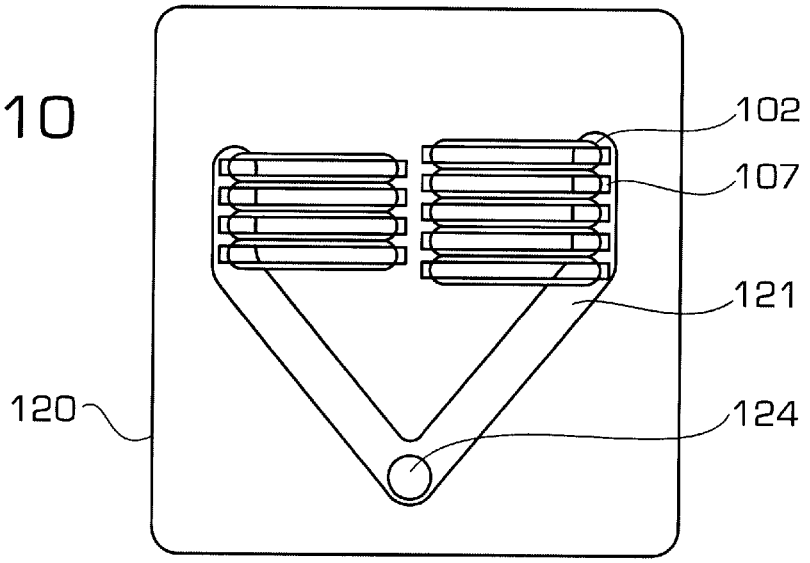
FIG. 10 is an explanatory diagram showing the positional relationships between pressure chambers in the print head.
Figure 11:
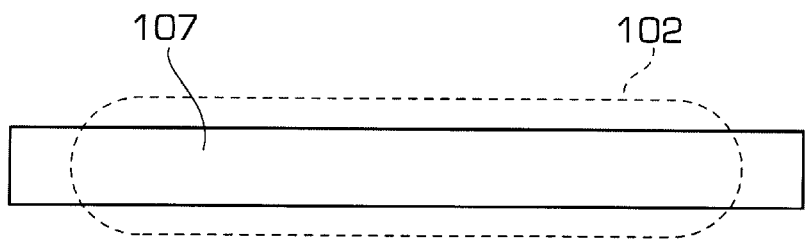
FIG. 11 is an explanatory diagram showing the position of a piezoelectric transducer in the print head.
Figure 9:
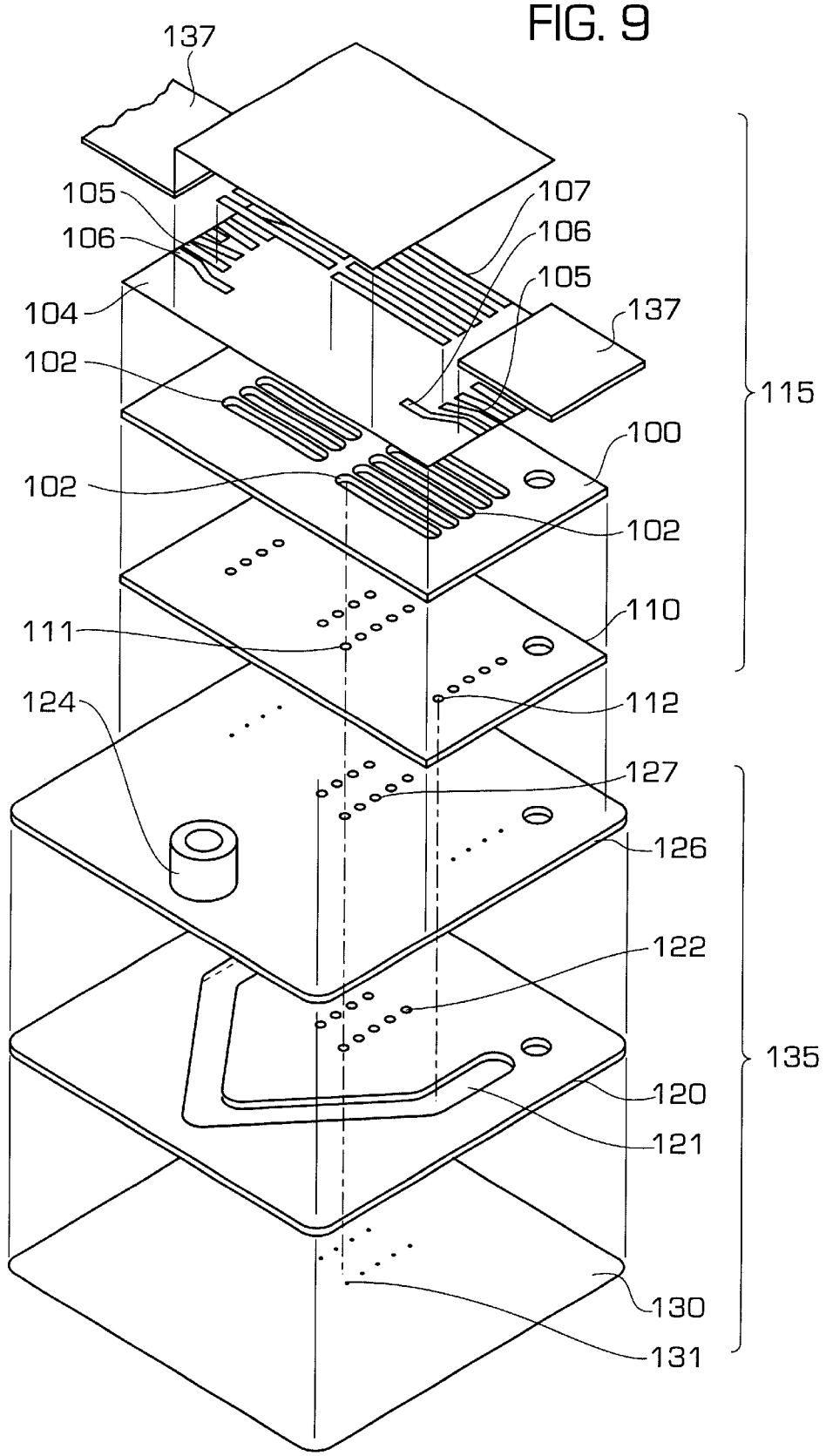
FIG. 9 is an exploded perspective view of the print head shown in FIG. 8.
Figure 12:
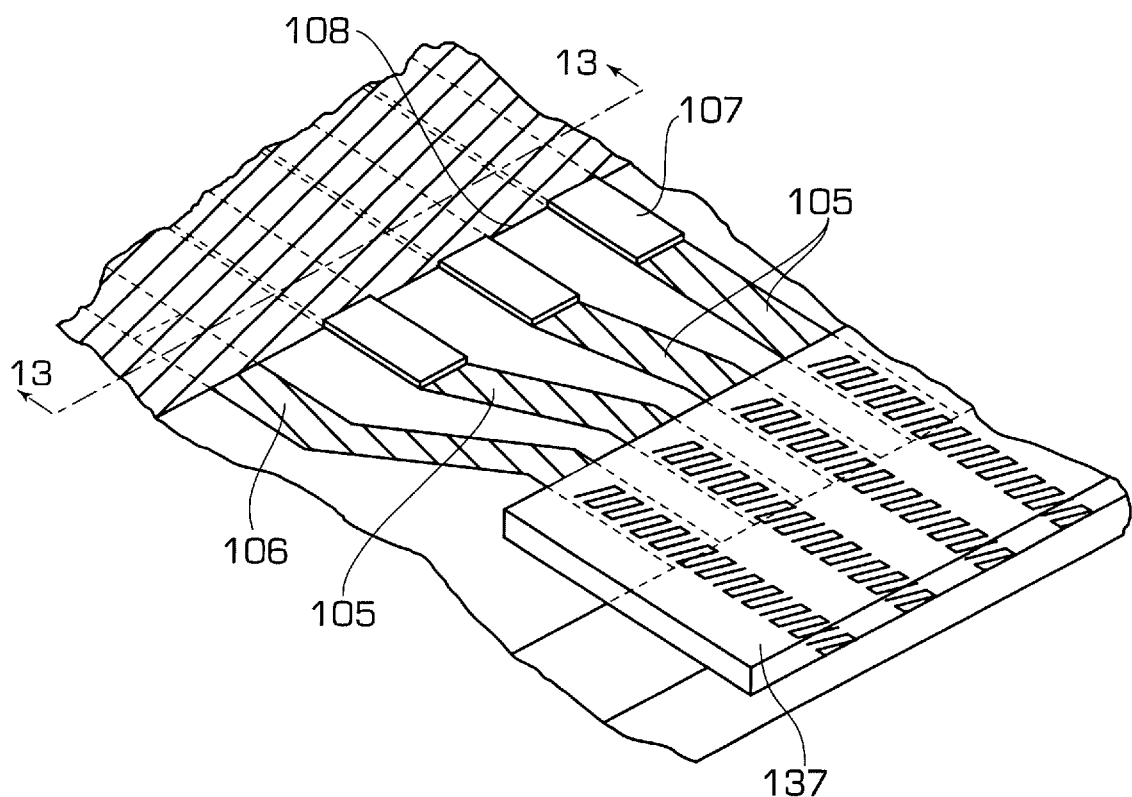
FIG. 12 is a perspective view showing the positional relationships between piezoelectric transducers and electrodes in the print head.

FIGS. 8 and 9 respectively illustrate a cross-sectional view and a exploded perspective view showing another multi-layer ink jet print head constructed in accordance with the invention. In these figures, reference numeral 100 designates a spacer made of a ceramic plate of zirconia ($ZrO_2$) or the like having a thickness of 150 $\mu$m. The spacer 100 has a number of elongated holes 102 formed at predetermined intervals therein, thus forming ink pressure chambers. Each of the elongated holes 102 has one end portion located over an ink supply channel 121 as shown in FIG. 3, and the other end portion located over a nozzle opening 131. A closure plate or diaphragm 104 is fixedly mounted on one surface of the spacer 100. The closure plate 104 is made of a material which, when fired together with the spacer 100, is compatible in characteristics with the latter, and it has a high elastic modulus. In this embodiment, the closure plate 104 is made of a thin zirconia plate 10 $\mu$m in thickness, similar to the spacer 100. As shown in FIG. 12, on the surface of the closure plate 104, electrodes 105 for applying drive signals to piezoelectric transducers 107 are provided in correspondence to the ink pressure chambers 102, and lead-out electrodes 106 of a common electrode (described below) are provided.

Figure 13:
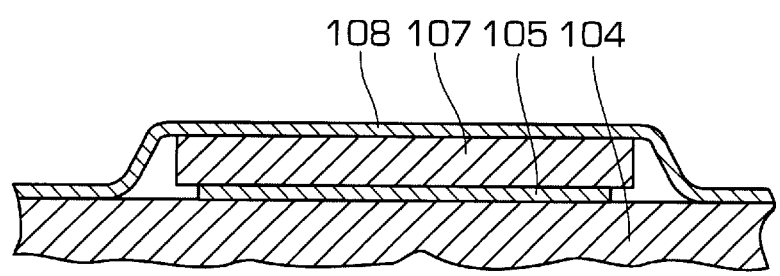
FIG. 13 is a sectional view taken along a line A—A in FIG. 12 showing the structure of the piezoelectric transducer mounted on a diaphragm in the print head.

The piezoelectric transducers 107 cover the drive signal applying electrodes 105. More specifically, each of the transducers 107 is made of a thin plate of piezoelectric vibrating material such as PZT, which is substantially equal in length to the ink pressure chamber 102 but smaller in width than the latter, as shown in FIG. 4. That is, the transducer 107 is designed so that it flexes in such a manner as to curve in the direction of width with the longitudinal direction as an axis. As shown in FIGS. 12 and 13, the aforementioned common electrode 108 is formed on the piezoelectric transducers 107 and the lead-out electrodes 106, for instance, by sputtering. That is, the lower surface (on the side of the closure plate 104) of each piezoelectric transducer 107 is connected to the drive signal applying electrode 105, and the upper surface is connected to the common electrode 108.

Further in FIGS. 8 and 9, reference numeral 110 designates a connecting plate which, together with the closure plate 104, forms the ink pressure chambers 102. The connecting plate 110 is made of a material which, when fired together with the spacer 100, is compatible be in characteristics with the latter. In this embodiment, it is made of a thin zirconia plate 150 $\mu$m in thickness. The connecting plate 110 has through-holes 111 through which the nozzles openings 131 are communicated with the ink pressure chambers 102, and through-holes 112 through which the ink supply channel 121 is communicated with the ink pressure chambers 102.

The above-described members 100, 104 and 110 are fixedly combined together, thus forming a pressure generating unit 115.

Reference numeral 120 designates a channel plate of a flow path unit 135. The channel plate 120 is made of a corrosion-resistant plate such as a stainless steel plate 150 $\mu$m in thickness and which is suitable for formation of ink flow paths. The channel plate 120 has a substantially V-shaped through-hole forming the aforementioned ink supply channel 121, and through-holes 122 through which the ink pressure chambers 102 are communicated with the nozzle openings 131. The through-hole forming the ink supply channel 121 extends radially of an ink supplying inlet member 124 and then parallel to the ends of the ink pressure chambers 102. More specifically, in the embodiment having the nozzle openings in two lines, the through-hole forming the ink supply channel 121 includes a V-shaped portion extending radially outward of the ink supplying inlet member 124, and two parallel portions extending from the two outer ends of the V-shaped portion along the ends of the ink pressure chambers 102.

Reference numeral 126 designates an orifice plate fixed to one surface of the above-described channel plate 120. The orifice plate 126 has through-holes 127 through which the ink pressure chambers 102 are communicated with the nozzle openings 131, and through-holes 128 through which the ink supply channel 121 is communicated with the ink pressure chambers 102. The orifice plate 126 further has the ink supplying inlet member 124 on its surface, which is connected to an ink tank (not shown).

Reference numeral 130 designates a nozzle plate fixed to the other surface of the channel plate 120. The nozzle plate 130 is made of a stainless steel plate 60 μm in thickness and which is suitable for formation of nozzle openings 40 μm in diameter. The nozzle openings 131 in the nozzle plate 130 are formed in correspondence with the ink pressure chambers 102.

The members 120, 126 and 130 are stacked one on another and fixed together as a unit using an adhesive or by welding using diffusion between metals, thereby to form the aforementioned flow path unit 135. In this operation, the stacking of the members is performed under a high pressure; however, they can be accurately stacked one on another without intrusion or deformation although the large through-hole for forming the ink supply channel 121 is within in the stack because the members are made of metal, as described above.

The pressure generating unit 115 and the flow path unit 135 are joined through their confronting surfaces, namely, the contact surfaces of the connecting plate 110 and the orifice plate 126, with an adhesive, thereby to form the print head.

Thus, the ink pressure chambers 102 are communicated through the through-holes 112 of connecting plate 110 and the through-holes 128 of the orifice plate 126 with the ink supply channel 121, and they are further communicated through the through-holes 111 of the connecting plate 110, the through-holes 127 of the orifice plate 126 and the through-holes 122 of the channel plate 120 with the nozzle openings 131.

Figure 14:
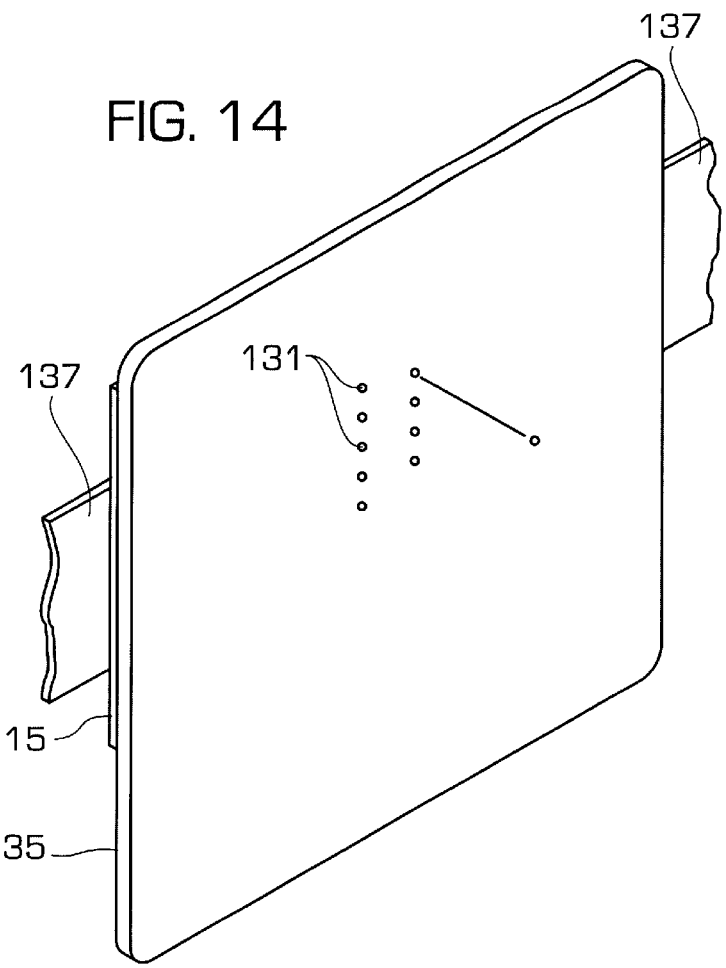
FIG. 14 is a perspective view outlining the print head.
Figure 15:
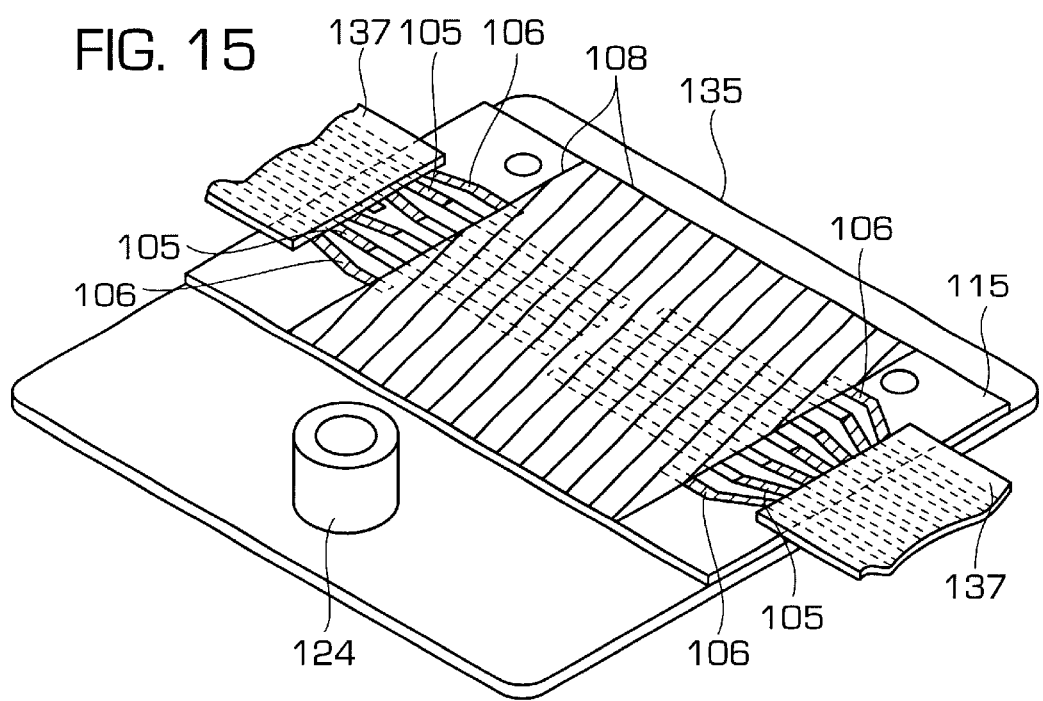
FIG. 15 is a perspective view showing the rear structure of the print head.

FIGS. 14 and 15 illustrate the front and rear structures of the multi-layer ink jet type print head according to the invention. In the front structure, the nozzle openings are arranged in two lines at predetermined intervals. In the rear structure, the pressure generating unit 115 is fixedly secured to the flow path unit 135, and cables 137 are provided for applying electrical signals to the piezoelectric transducers 107.

Figure 16A:
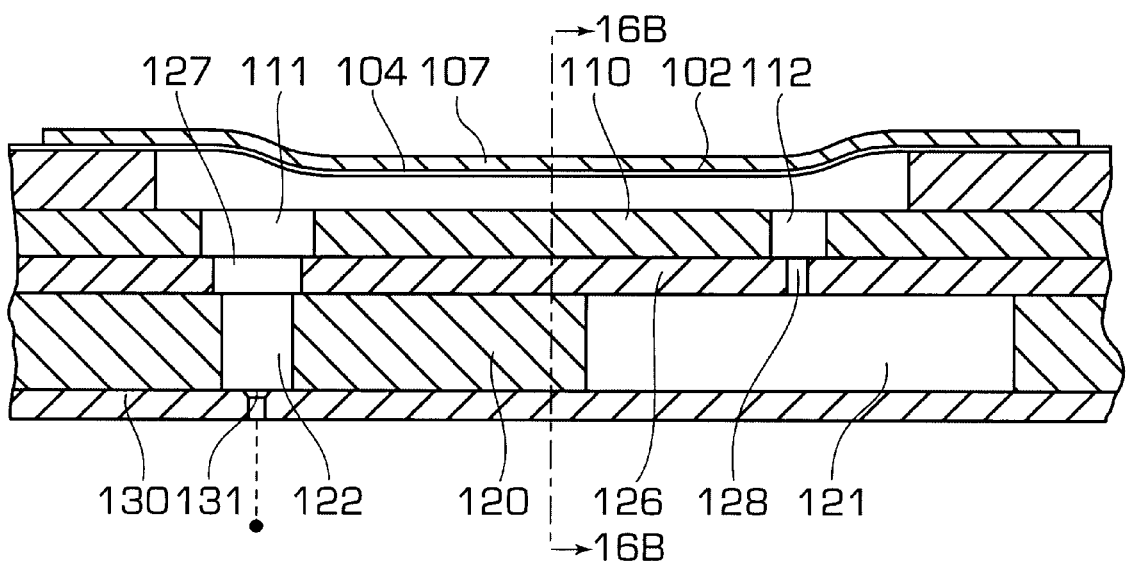
FIGS. 16(a) and 16(b) are, respectively, a longitudinal sectional view and a cross-sectional view taken along a line B—B in FIG. 16(a) showing the print head jetting an ink droplet.
Figure 16B:
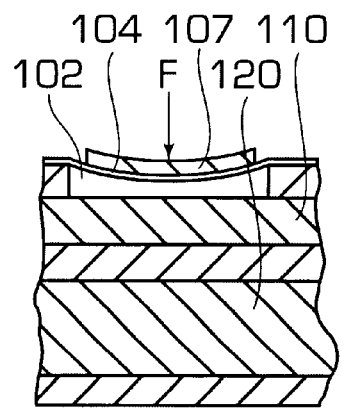
Figure 17A:
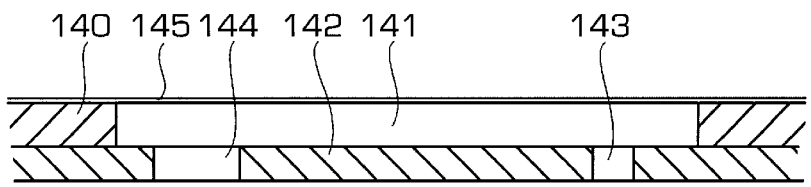
FIGS. 17(a)–17(e) are sectional views for a description of a method for manufacturing a multi-layer type ink jet type print head according to the invention.
Figure 17B:
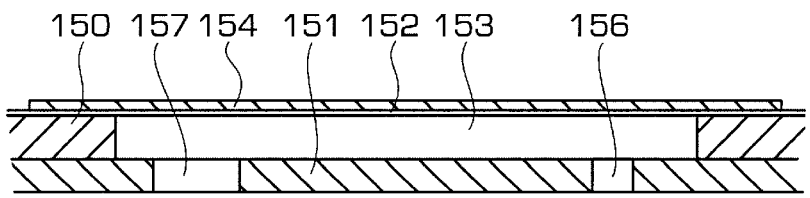
Figure 17C:
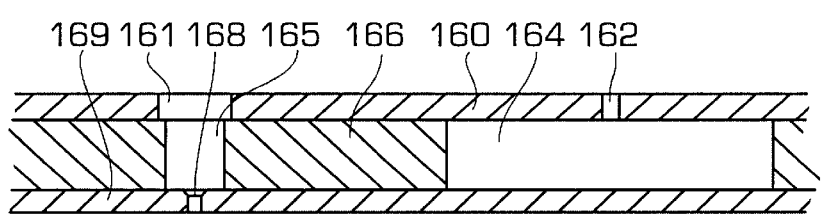
Figure 17D:
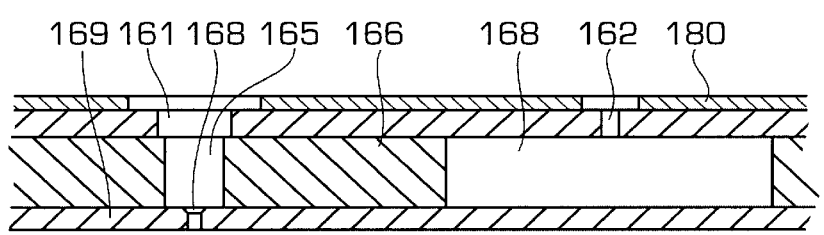
Figure 17E:
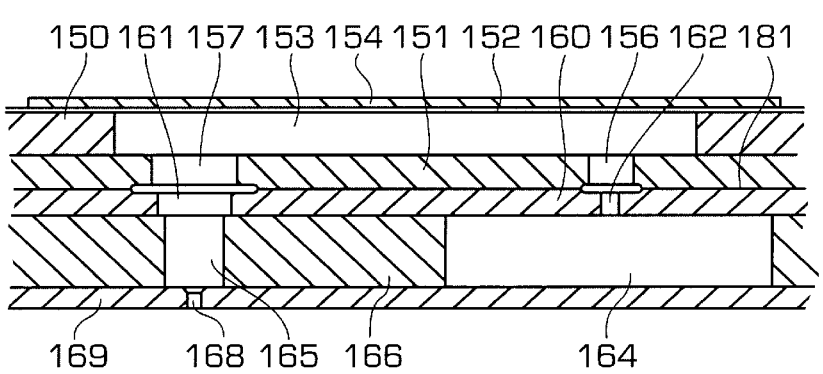

When a drive signal is applied to any one of the piezoelectric transducers 107, the respective transducer 107 is flexed in the direction of width with the longitudinal direction as an axis, thus deforming the closure plate 104 towards the ink pressure chamber as shown in FIG. 16. As a result, the volume of the corresponding ink pressure chamber 102 is decreased; that is, pressure is applied to the ink in the ink pressure chamber. Hence, the ink in the ink pressure chamber 102 is forced to move through the corresponding through-hole 111 of the connecting plate 110, the through-hole 127 of the orifice plate 126 and the through-hole 122 of the channel plate 20 in the flow path unit 135 into the nozzle opening 131, from which it is jetted in the form of an ink droplet.

The ink flow paths extending from the ink pressure chambers 102 to the nozzle openings 131 are defined by the through-holes 111, 127 and 122, which are formed in the connecting plate 110, the orifice plate 126 and the channel plate 120, respectively. The through-holes 111, 127 and 122 are reduced in diameter in the stated order, which substantially prevents air from entering into the ink pressure chamber through the ink flow path even when the meniscus of the ink in the nozzle is destroyed and drawn toward the ink pressure chamber. The ink in the ink pressure chamber 102 may flow through the through-holes 112 and 128 into the ink supply channel 121; however, since the through-hole 128 is small in diameter, this flow of ink will not greatly reduce the pressure; that is, it will not adversely affect the jetting of the ink droplet.

When the application of the drive signal is suspended, that is, when the piezoelectric transducer 107 is restored to its unexcited state, the volume of the ink pressure chamber 102 is increased so that a negative pressure is formed in the ink pressure chamber 102. As a result, the same amount of ink as previously consumed is supplied from the ink supply channel 121 through the through-holes 128 and 112 into the ink pressure chamber 102. The negative pressure in the ink pressure chamber 102 acts on the nozzle opening 131; however, the meniscus in the nozzle openings prevents the ink from returning towards the pressure chambers. Therefore, the negative pressure is effective in sucking the ink from the reservoir 121.

The flow path unit 135 is connected to the pressure generating unit 15 through a thick layer of macromolecular adhesive about 30 μm in thickness. Therefore, even if, when the ambient temperature changes, the two units 135 and 115 are urged to shift relative to each other because of a difference in thermal expansion, the shift is absorbed by the layer of macromolecular adhesive, so that the nozzle plate is prevented from being bent; that is, the layer of macromolecular adhesive prevents the formation of prints low in quality.

A method for manufacturing the above-described print head now will be described with reference to FIGS. 17(a)–17(e).

A ceramic material having a thickness suitable for formation of the ink pressure chambers 102 by firing is prepared. In the present embodiment, a thin plate of zirconia having a clay-like consistency, namely, "a green sheet" is used for formation of a first sheet 140. A press is used to form through-holes 141 in the green sheet at the positions where the ink pressure chambers 102 are to be formed. Similarly as in the case of the first sheet, a second sheet 142 is machined on the press. That is, through-holes 143 and 144 through which the ink supply channel 121 is communicated with the nozzle openings 131 are formed in a green sheet of zirconia having a thickness suitable for formation of the connecting plate 110.

The first sheet 140 is set on the second sheet 142, and a third sheet 145 is placed on the first sheet 140, which is made of a green sheet of zirconia having a thickness suitable for formation of the diaphragm or closure plate 104. The three sheets 140, 142 and 145 are joined to one another under uniform pressure, and then dried. In this drying step, the three sheets 140, 142 and 145 are temporarily bonded together and semi-solidified. The assembly of these sheets is fired at a predetermined temperature, for instance 1000° C., while the assembly is pressurized to the extent that the assembly is prevented from bending. As a result, the sheets are transformed into ceramic plates, the interfaces of which are combined together by firing. That is, they are formed into an integral unit.

As described above, the through-holes 141 forming the ink pressure chambers are formed in the first sheet 140. The through-holes 141 are extremely small in width. Hence, when the three sheets are temporarily bonded together, the second and third sheets 142 and 145 (which form the connecting plate and the closure plate, respectively) are not deformed, and the pressure is suitably concentrated at the through-holes 141, which contributes to the combining of the second and third sheets 142 and 145 with the first sheet 140 by firing. Thus, the volume of each pressure chamber can be set as required.

The first, second and third sheets 140, 142 and 145 thus fired function as a spacer 150, a connecting plate 151 and a closure plate 152, respectively. In this state, electrically conductive paste layers are formed on the surface of the closure plate 152 at the positions of the ink pressure chambers 153 and of the common electrode lead-out terminals by a thick film printing method. Relatively thick layers of piezoelectric materials of a clay-like consistency are formed with a mask by printing so as to provide through-holes in correspondence to the ink pressure chamber 153. When the thick layers have been dried to the extent that they are suitable for firing the transducer-forming materials, the whole assembly is heated at a temperature suitable for firing the piezoelectric transducers and the electrodes, for instance, in a range of from 1000° C. to 1200° C. Thus, the piezoelectric transducers 154 are formed for the respective ink pressure chambers 153 (see FIG. 17 (b)).

Thereafter, a layer of electrically conductive material is formed over the common electrode lead-out terminals and the piezoelectric transducers 154 by a thin film forming method such as a sputtering method. Thus, the pressure generating unit is formed, which appears as if it were made of a single component although it includes the closure plate, the spacer and the connecting plate.

Figure 18:
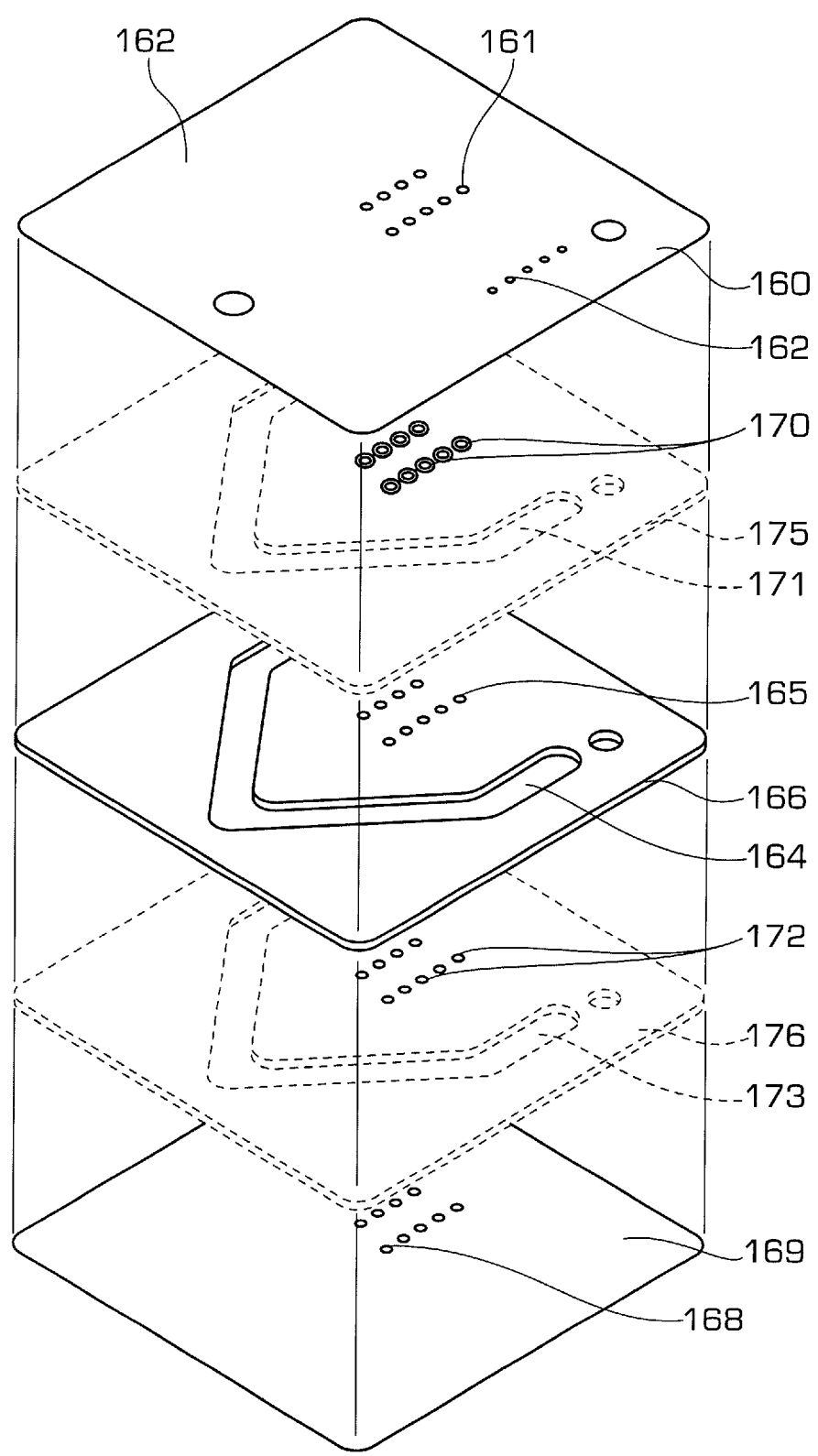
FIG. 18 is an exploded view for a description of a step of joining plates together to form a flow path unit.

On the other hand, an orifice plate 160, a channel plate 166, and a nozzle plate 169 are prepared using metal plates having respective predetermined thicknesses. That is, the orifice plate 160 is formed by forming through-holes 161 and 162, which correspond to the through-holes 127 and the flow path regulating holes 128, in the metal plate on the press. The orifice plate 160 is formed by cutting through-holes 164 and 165, which correspond to the ink supply channel 121 and the through-holes 122, in the metal plate on the press. The nozzle plate 169 is also formed by forming through-holes 168, which correspond to the nozzle openings 131, in the metal plate on the press. As shown in FIG. 18, a bonding film 175 having through-holes 170 and a through-hole 171 is inserted between the plates 160 and 166, while a bonding film 176 having through-holes 172 and a through-hole 173 is inserted between the plates 166 and 169. In this connection, it should be noted that the through-holes 170, 171, 172 and 173 are formed in the bonding films 175 and 176 in such a manner that the remaining portions of the films 175 and 176, namely, the bonding regions thereof, do not cover the through-holes 161, 162, 164, 165 and 168 of the plates 160, 166 and 169. The plates 160, 164 and 169 and the films 175 and 176, which have been stacked in the above-described manner, are thermally bonded under pressure to form the flow path unit.

Figure 19A:
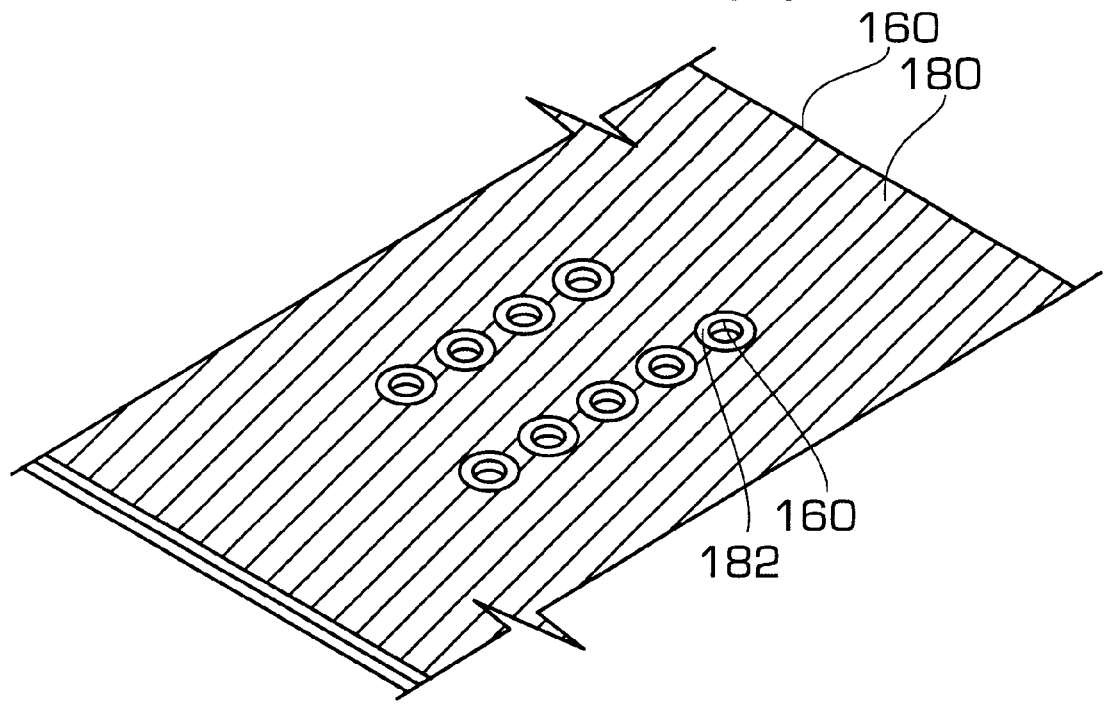
FIGS. 19(a) and 19(b) are diagrams showing an adhesive layer through which the flow path unit is joined to a pressure generating unit.
Figure 19B:
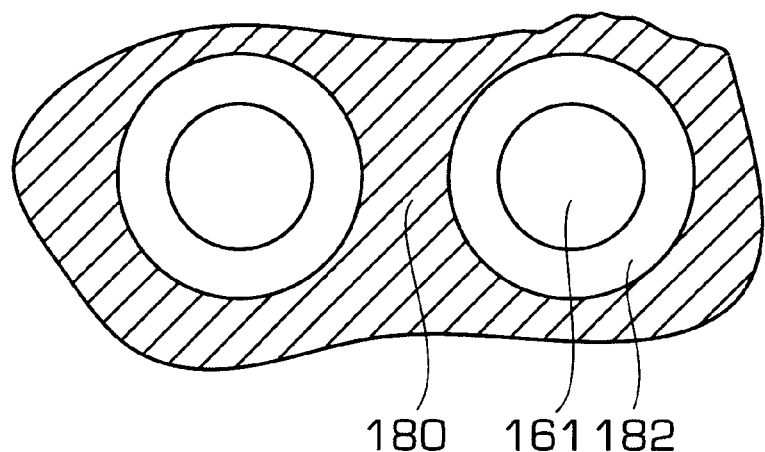

The pressure generating unit and the flow path unit are joined as follows: As shown in FIG. 19(a), an adhesive layer 180 is formed on the surface of one of the units, for instance, the surface of the channel plate 160, by coating it with adhesive or by using a thermal welding film (see FIG. 17(d)), and the connecting plate 151 of the pressure generating unit is placed on the adhesive layer 180 thus formed in such a manner that the through-holes 156 and 157 are coaxial with the through-holes 162 and 161 (FIG. 17(e)). As a result, an adhesive layer 181 is formed between the flow path unit and the pressure generating unit, which serves as a cushion member to absorb the difference in thermal expansion between the two members. The adhesive layer 180 spreads outward when squeezed between the two units. As shown in FIGS. 19(a) and 19(b), there are provided regions 182 around the through-holes where no adhesive is provided, thereby to prevent the adhesive from spreading into the through-holes of the connecting plate 151 and the orifice plate 160.

In the print head of the invention, the pressure generating unit is made of ceramic, which has a lower density than metal, and therefore vibration propagating between adjacent piezoelectric transducers is greatly attenuated; that is, crosstalk is prevented. Furthermore, the elements forming the vibrating portion of the print head of the invention are joined as an integral unit without the intrusion of any foreign member. This feature positively eliminates the difficulty of ink leaking because of inadequate adhesion.

Furthermore, in the print head of the invention, the base of the pressure generating unit and the ceramics forming the vibration generating unit are fired at temperature suitable therefor. Thus, the operation of the print head is high in reliability.

The pressure generating unit according to the present invention is advantageous in that it has very good liquid tightness, and the signal applying electrodes can be installed directly thereon. On the other hand, the flow path unit having a relatively large recess to form the ink supply channel is made of metal, and thus is high in rigidity. In addition, the ceramic pressure generating unit and the metal flow path unit are joined together with a macromolecular adhesive agent relatively high in elasticity. Hence, bending of these units due to the difference in thermal expansion is positively prevented. As a result, the ink jet type print head of the invention can be made relatively small in thickness, and it is high in reliability.

Moreover, the principle of the present invention is applicable to ink jet print heads of on-demand type or continuous jet type, and to these types of ink jet print heads having various structures.

It is to be understood that the present invention may be modified by one skilled in the art without departing from the spirit and scope of the invention.

What is claimed is:

1. A method of manufacturing a layer-built ink jet type print head comprising:

laying a green sheet of ceramic material having a thickness suitable for formation of a vibrating member, a green sheet of ceramic material having through-holes corresponding to ink pressure chambers, and a green sheet having through-holes corresponding to flow paths to said ink pressure chambers, one on another in the stated order in order to form a pressure generating basic unit;

firing said green sheets to thereby form said pressure generating basic unit comprising a vibrating plate, a spacer plate and a connecting plate;

forming signal applying electrodes in correspondence to said ink pressure chambers and lead-out electrodes on said vibrating plate;

bonding a green sheet of piezoelectric material to each of said signal applying electrodes;

firing said green sheet of piezoelectric material with said fired pressure generating basic unit to form a pressure generating unit;

laying a first metal plate, in which are defined a flow path to an ink tank and which has through-holes through which nozzle openings are communicated with said ink pressure chambers and said ink pressure chambers are communicated with an ink supply channel, a second metal plate having a through-hole corresponding to said ink supply channel and through-holes through which said ink pressure chambers are communicated with said nozzle openings, and a nozzle plate having said nozzle openings, one on another in the stated order and fixing said metal plates and said nozzle plate together to form a flow path unit; and joining said pressure generating unit and said flow path unit.

2. The method as claimed in claim 1, wherein said step of joining said pressure generating unit to said flow path unit comprises applying an adhesive agent.

3. The method as claimed in claim 2, wherein, in applying said adhesive agent, a region is left around said through-holes containing no adhesive agent.

4. The method as claimed in claim 2, wherein said adhesive agent is a macromolecular adhesive.

5. The method as claimed in claim 1, wherein said through-holes through which said ink pressure chambers are communicated with said nozzle openings are respectively reduced in diameter towards said nozzle openings.

6. The method as claimed in claim 5, wherein said through holes through which said ink pressure chambers are communicated with said nozzle openings are reduced in diameter stepwise in each of said green sheet, said first metal plate and said second metal plate.

* * * * *

UNITED STATES PATENT AND TRADEMARK OFFICE
CERTIFICATE OF CORRECTION

PATENT NO.    : 6,290,340 B1
DATED         : September 18, 2000
INVENTOR(S)   : Kohei Kitahara, Takeuchi Tukihisa, Hides Masumori and Hideaki Sonehara It is certified that error appears in the above-identified patent and that said Letters Patent is hereby corrected as shown below:

<u>Title page,</u>
Item [30], please insert:

| -- [30] | Foreign Application Priority Data | | |
|---|---|---|---|
| May 27, 1992 | [JP] | Japan | 4-160204 |
| Aug. 26, 1992 | [JP] | Japan | 4-227503 |
| Oct. 12, 1992 | [JP] | Japan | 4-273149 |
| Dec. 15, 1992 | [JP] | Japan | 4-334592 |
| Mar. 15, 1993 | [JP] | Japan | 5-080070 |
| Mar. 22, 1993 | [JP] | Japan | 5-087996 -- |

Signed and Sealed this

Third Day of September, 2002

*Attest:*

*Attesting Officer*

JAMES E. ROGAN
*Director of the United States Patent and Trademark Office*